US012757534B2

(12) United States Patent
Zhang et al.

(10) Patent No.: US 12,757,534 B2
(45) Date of Patent: Oct. 6, 2026

(54) MICRO LIGHT-EMITTING DIODE DISPLAY AND METHOD OF MANUFACTURING MICRO LIGHT-EMITTING DIODE DISPLAY

(71) Applicant: CHONGQING KONKA PHOTOELECTRIC TECHNOLOGY RESEARCH INSTITUTE CO., LTD., Chongqing (CN)

(72) Inventors: Pengyue Zhang, Chongqing (CN); Fei Pan, Chongqing (CN); Jingwei Huang, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 585 days.

(21) Appl. No.: 18/311,413

(22) Filed: May 3, 2023

(65) Prior Publication Data

US 2023/0275192 A1 Aug. 31, 2023

Related U.S. Application Data

(63) Continuation of application No. PCT/CN2021/126701, filed on Oct. 27, 2021.

(51) Int. Cl.
*H10H 20/84* (2025.01)
*H10H 20/01* (2025.01)
(Continued)

(52) U.S. Cl.
CPC ........ *H10H 20/84* (2025.01); *H10H 20/0362* (2025.01); *H10H 20/034* (2025.01);
(Continued)

(58) Field of Classification Search
CPC ... H01L 25/0753; H01L 20/84; H01L 20/034; H01L 20/0362; H01L 20/854;
(Continued)

(56) References Cited

U.S. PATENT DOCUMENTS

2019/0006554 A1* 1/2019 Kususe ............... H01L 25/0753
2021/0167045 A1* 6/2021 Meng ................. H01L 25/0753
2021/0305078 A1* 9/2021 Liang ................. H01L 25/0753

FOREIGN PATENT DOCUMENTS

CN 103354810 A 10/2013
CN 106019692 A 10/2016
(Continued)

OTHER PUBLICATIONS

Horng et al, "Fabrication and Study on Red Light Micro-LED Displays", in IEEE Journal of the Electron Devices Society, vol. 6, pp. 1064-1069, 2018. (Year: 2018).*
(Continued)

*Primary Examiner* — A. Dexter Tugbang
(74) *Attorney, Agent, or Firm* — HAUPTMAN HAM, LLP

(57) ABSTRACT

A manufacturing method of a micro light-emitting diode (LED) display and a micro LED display are provided in the present disclosure, and the method includes the following. A display substrate is provided. Multiple micro LEDs are disposed on the display substrate. A first adhesive material layer is formed on the multiple micro LEDs. A region between adjacent micro LEDs is filled with the first adhesive material layer. A light-shielding layer is formed between the adjacent micro-LEDs by irradiating the first adhesive material layer with a light.

10 Claims, 5 Drawing Sheets

(51) Int. Cl.
*H10H 20/854* (2025.01)
*H10H 20/855* (2025.01)
*H10W 90/00* (2026.01)

(52) U.S. Cl.
CPC ......... *H10H 20/854* (2025.01); *H10H 20/855* (2025.01); *H10W 90/00* (2026.01); *Y10T 29/4913* (2015.01)

(58) Field of Classification Search
CPC .. H01L 20/855; H10H 20/84; H10H 20/0362; H10H 20/034; H10H 20/854; H10H 20/855; H10W 90/10; Y10T 29/4913
See application file for complete search history.

(56) References Cited

FOREIGN PATENT DOCUMENTS

| | | | | | |
|---|---|---|---|---|---|
| CN | 108511390 A | | 9/2018 | | |
| CN | 109471294 A | | 3/2019 | | |
| CN | 109638138 A | | 4/2019 | | |
| CN | 110161809 A | | 8/2019 | | |
| CN | 110767108 A | | 2/2020 | | |
| CN | 110875346 A | | 3/2020 | | |
| CN | 111863797 A | | 10/2020 | | |
| JP | H0962202 A | | 3/1997 | | |
| JP | 2019140361 A | * | 8/2019 | ............... | G09F 9/00 |
| KR | 20190060968 A | | 6/2019 | | |

OTHER PUBLICATIONS

The International Search Report issued in corresponding International Application No. PCT/CN2021/126701, mailed May 9, 2022.
The first office action issued in corresponding CN application No. 202111253815.7 dated Jul. 11, 2022.
The second office action issued in corresponding CN application No. 202111253815.7 dated Aug. 30, 2022.
Notice of allowance issued in corresponding CN application No. 202111253815.7 dated Oct. 31, 2022.

* cited by examiner

MICRO LIGHT-EMITTING DIODE DISPLAY AND METHOD OF MANUFACTURING MICRO LIGHT-EMITTING DIODE DISPLAY

CROSS-REFERENCE TO RELATED APPLICATIONS

This application is a continuation of International Application No. PCT/CN2021/126701, filed Oct. 27, 2021, the entire disclosure of which is hereby incorporated by reference.

TECHNICAL FIELD

This disclosure relates to the field of semiconductor manufacturing technology, and in particular to a micro light-emitting diode (LED) display and a manufacturing method thereof.

BACKGROUND

Micro light-emitting diode (LED) (including mini LED and micro LED) displays are a new generation of display technologies, and have advantages of higher brightness, better light-emitting efficiency, and lower power consumption compared with liquid crystal displays.

After micro LEDs are transferred to a display substrate, the micro LEDs need to be packaged, and a light-shielding layer needs to be deposited between adjacent micro LEDs, such that cross color between the adjacent micro LEDs is avoided. At present, the light-shielding layer needs to be manufactured by multiple times of packaging and delamination, and a manufacturing process is relatively complex; or the light-shielding layer is made of liquid epoxy resin and a carbon-containing material, but the light-shielding layer formed by the liquid epoxy resin and the carbon-containing material has a relatively poor light-shielding ability and is easy to cause cross color.

Therefore, how to simplify steps of forming the light-shielding layer and improve the light-shielding ability of the light-shielding layer is an urgent problem to be solved.

SUMMARY

In a first aspect, a manufacturing method of a micro light-emitting diode (LED) display is provided in the present disclosure. The method includes the following. A display substrate is provided. Multiple micro LEDs are disposed on the display substrate. A first adhesive material layer is formed on the multiple micro LEDs. A region between adjacent micro LEDs is filled with the first adhesive material layer. A light-shielding layer is formed between the adjacent micro-LEDs by irradiating the first adhesive material layer with a light.

In a second aspect, a micro LED display is further provided in the present disclosure. The micro LED display includes a display substrate, multiple micro LEDs, and a light-shielding layer. The multiple micro LEDs are disposed on the display substrate. The light-shielding layer is disposed between adjacent micro LEDs. The light-shielding layer is formed as follows. A first type of adhesive material is sprayed on the multiple micro LEDs and between the adjacent micro LEDs to form a first adhesive material layer. A first photoresist layer is formed on the first adhesive material layer. The first photoresist layer covers the multiple micro LEDs. The first adhesive material layer is irradiated with a light by using the first photoresist layer as a mask, to make the first adhesive material layer irradiated become black to form the light-shielding layer.

In a third aspect, a micro LED display is further provided in the present disclosure. The micro LED display includes a display substrate, multiple micro LEDs, and a light-shielding layer. The multiple micro LEDs are disposed on the display substrate. The light-shielding layer is disposed between adjacent micro LEDs. The light-shielding layer is formed as follows. A second type of adhesive material is sprayed on the multiple micro LEDs and between the adjacent micro LEDs to form a first adhesive material layer. A first photoresist layer is formed on the first adhesive material layer. The first photoresist layer covers a region between the adjacent micro LEDs. The first adhesive material layer is irradiated with a light by using the first photoresist layer as a mask, to make the first adhesive material layer irradiated with the light becomes transparent, and the first adhesive material layer that is between the adjacent micro LEDs and covered by the first photoresist layer form the light-shielding layer.

BRIEF DESCRIPTION OF THE DRAWINGS

To describe technical solutions in implementations of the present disclosure more clearly, the following briefly introduces accompanying drawings required for describing implementations. Apparently, the accompanying drawings in the following description show merely some implementations of the present disclosure, and those of ordinary skill in the art may still derive other drawings from these accompanying drawings without creative efforts.

REFERENCE SIGNS

Figure 1:
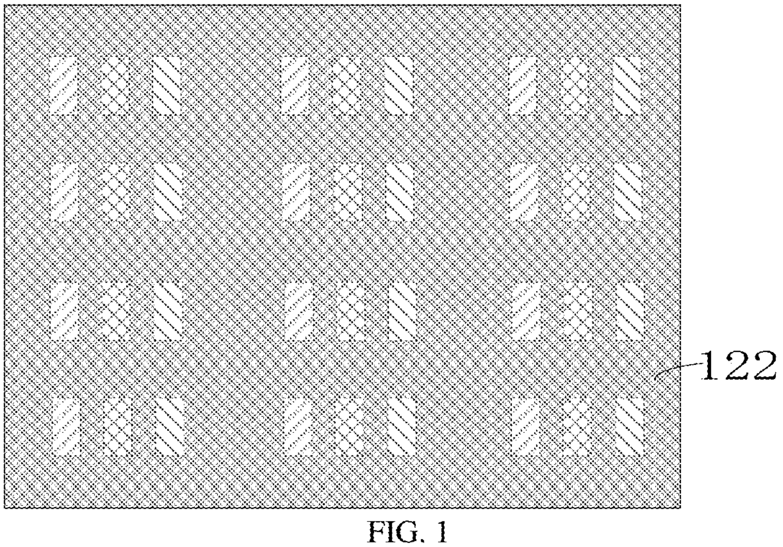
FIG. 1 is a top view of a micro light-emitting diode (LED) display in the present disclosure.

100 display substrate; 101 substrate; 102 driving device; 110 micro LED; 111 red micro LED; 112 green micro LED; 113 blue micro LED; 120 light-shielding layer; 121 first adhesive material layer; 122 second adhesive material layer; 123 first photoresist layer; 124 second photoresist layer.

DETAILED DESCRIPTION

In order to facilitate understanding of the present disclosure, a comprehensive description will be given below with reference to relevant accompanying drawings. The accompanying drawings illustrate some exemplary implementations of the present disclosure. However, the present disclosure can be implemented in many different forms and is not limited to implementations described herein. On the contrary, these implementations are provided for a more thorough and comprehensive understanding of the present disclosure.

Unless otherwise defined, all technical and scientific terms used herein have the same meaning as commonly understood by those skilled in the art of the present disclosure. The terms used herein in the specification of the present disclosure are for the purpose of describing specific implementations only and are not intended to limit the present disclosure.

In the description of the present disclosure, it should be understood that directional relationship or positional relationship indicated by terms such as "center", "on", "under", "front", "back", "left", "right", and the like is directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure. In addition, terms "first", "second", and the like are only used for description and cannot be understood as explicitly or implicitly indicating relative importance.

In view of the above deficiencies in the related art, the present disclosure aims to provide a micro light-emitting diode (LED) display and a manufacturing method thereof, so as to simplify steps of forming a light-shielding layer and improve a light-shielding ability of the light-shielding layer.

To solve the above technical problems, the present disclosure is implemented by following technical solutions.

In a first aspect, a manufacturing method of a micro LED display is provided in the present disclosure. The method includes the following. A display substrate is provided. Multiple micro LEDs are disposed on the display substrate. A first adhesive material layer is formed on the multiple micro LEDs. A region between adjacent micro LEDs is filled with the first adhesive material layer. A light-shielding layer is formed between the adjacent micro-LEDs by irradiating the first adhesive material layer with a light.

In the above manufacturing method of the micro LED display, the first adhesive material layer is formed on the multiple micro LEDs and between the adjacent micro LEDs, and the light-shielding layer is formed between the adjacent micro-LEDs by irradiating the first adhesive material layer with the light, such that a forming method is simple and effective, a flow process is simplified, and the light-shielding layer formed is able to effectively avoid cross color between the adjacent micro LEDs of different colors, thereby improving a light-emitting effect of the micro LEDs.

In some implementations, the first adhesive material layer is formed on the multiple micro LEDs as follows. A first type of adhesive material is sprayed on the multiple micro LEDs and between the adjacent micro LEDs. The first type of adhesive material is hot-pressed under a preset pressure, to make the first type of adhesive material fill the region between the adjacent micro LEDs.

In some implementations, the preset pressure ranges from 4.5 MPa to 7 MPa, and a temperature during hot-pressing ranges from 150° C. to 220° C.

In some implementations, the first type of adhesive material includes silver halide, silver chloride, or silver fluoride.

In some implementations, the light-shielding layer is formed as follows. A first photoresist layer is formed on the first adhesive material layer. The first photoresist layer covers the multiple micro LEDs. The first adhesive material layer is irradiated with the light by using the first photoresist layer as a mask, to make the first adhesive material layer irradiated becomes black to form the light-shielding layer.

In arrangement of the first type of adhesive material and the first photoresist layer, a first transparent adhesive material layer can be formed on the micro LEDs and between the adjacent micro LEDs first, and after being irradiated with the light, the first adhesive material layer between the adjacent micro LEDs becomes black to form the light-shielding layer. This process is simple and controllable, and the light-shielding layer formed is relatively smooth.

In some implementations, the light has a wavelength ranging from 190 nm to 400 nm, and the light is perpendicular to a plane where the first adhesive material layer is located. It can be ensured that the first adhesive material layer covered by the first photoresist layer is not irradiated with the light, and is still the first transparent adhesive material layer, such that the first adhesive material layer is easily etched later.

In some implementations, the manufacturing method of the micro LED display further includes the following. A second photoresist layer is formed on the light-shielding layer.

A region of the first adhesive material layer where no light-shielding layer is formed is etched by using the second photoresist layer as a mask.

In some implementations, the manufacturing method of the micro LED display further includes the following. A second adhesive material layer is formed on the multiple micro-LEDs and the light-shielding layer. The second adhesive material layer is a transparent adhesive material layer.

In some implementations, the first adhesive material layer is formed on the multiple micro LEDs as follows. A second type of adhesive material is sprayed on the multiple micro LEDs and between the adjacent micro LEDs. The second type of adhesive material is hot-pressed under a preset pressure, to make the second type of adhesive material fill the region between the adjacent micro LEDs.

In some implementations, the second type of adhesive material includes a black photosensitizer, and the black photosensitizer becomes transparent after being irradiated with the light.

In some implementations, the second type of adhesive material includes a phenolic polymer.

In some implementations, the light-shielding layer is formed as follows. A first photoresist layer is formed on the first adhesive material layer. The first photoresist layer covers the region between the adjacent micro LEDs. The first adhesive material layer is irradiated with the light by using the first photoresist layer as a mask, to make the first adhesive material layer irradiated with the light becomes transparent, and the first adhesive material layer that is between the adjacent micro LEDs and covered by the first photoresist layer form the light-shielding layer.

In arrangement of the second type of adhesive material and the second photoresist layer, a first transparent adhesive material layer can be formed on the multiple micro LEDs and between the adjacent micro LEDs first, and after being irradiated with the light, the first adhesive material layer on the multiple micro LEDs becomes transparent, and the first adhesive material layer between the adjacent micro LEDs is still black to form the light-shielding layer.

In a second aspect, a micro LED display is further provided in the present disclosure. The micro LED display includes a display substrate, multiple micro LEDs, and a light-shielding layer. The multiple micro LEDs are disposed on the display substrate. The light-shielding layer is disposed between adjacent micro LEDs. The light-shielding layer is formed as follows. A first type of adhesive material is sprayed on the multiple micro LEDs and between the adjacent micro LEDs to form a first adhesive material layer. A first photoresist layer is formed on the first adhesive material layer. The first photoresist layer covers the multiple micro LEDs. The first adhesive material layer is irradiated with a light by using the first photoresist layer as a mask, to make the first adhesive material layer irradiated become black to form the light-shielding layer.

In some implementations, the micro LED display further includes a second adhesive material layer. The second adhesive material layer covers the multiple LEDs and the light-shielding layer to seal the multiple LEDs. The second adhesive material layer is a transparent adhesive material layer.

In some implementations, the first adhesive material layer has a thickness ranging from 20 μm to 60 μm.

In some implementations, the light-shielding layer exceeds each of the multiple micro LEDs by 10~50 μm.

In a third aspect, a micro LED display is further provided in the present disclosure. The micro LED display includes a display substrate, multiple micro LEDs, and a light-shielding layer. The multiple micro LEDs are disposed on the display substrate. The light-shielding layer is disposed between adjacent micro LEDs. The light-shielding layer is formed as follows. A second type of adhesive material is sprayed on the multiple micro LEDs and between the adjacent micro LEDs to form a first adhesive material layer. A first photoresist layer is formed on the first adhesive material layer. The first photoresist layer covers a region between the adjacent micro LEDs. The first adhesive material layer is irradiated with a light by using the first photoresist layer as a mask, to make the first adhesive material layer irradiated with the light becomes transparent, and the first adhesive material layer that is between the adjacent micro LEDs and covered by the first photoresist layer form the light-shielding layer.

In some implementations, the micro LED display further includes a second adhesive material layer. The second adhesive material layer covers the multiple LEDs and the light-shielding layer to seal the multiple LEDs. The second adhesive material layer is a transparent adhesive material layer.

In some implementations, the first adhesive material layer has a thickness ranging from 20 μm to 60 μm, to form the light-shielding layer exceeding each of the multiple micro LEDs.

In some implementations, the light-shielding layer exceeds each of the multiple micro LEDs by 10~50 μm.

In some implementations, the light-shielding layer exceeds each of the multiple micro LEDs by 10~50 μm. A relatively tall light-shielding layer can ensure relatively less interference of a forward light emitted by the micro LEDs, such that cross color between the adjacent micro LEDs of different colors is further avoided, thereby avoiding color shift caused by light mixing.

It is not necessary for any product implementing the present disclosure to realize all advantages described above at the same time.

Figure 2:
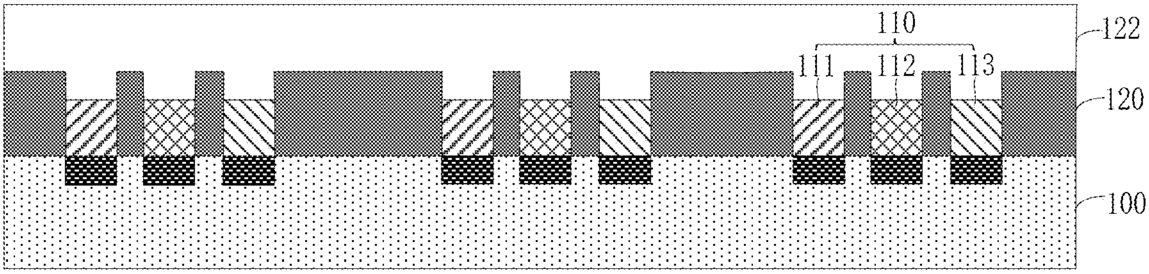
FIG. 2 is a schematic structural view of a micro LED display in the present disclosure.

Reference is made to FIG. 1 and FIG. 2. A micro LED display may include a display substrate 100 and multiple micro LEDs 110 disposed on the display substrate 100. The display substrate 100 is provided with a driving circuit. The driving circuit is configured to drive the micro LEDs 110 to operate. The multiple micro LEDs 110 are electrically connected with the driving circuit, and the multiple micro LEDs 110 are arranged in a matrix on the display substrate 100 to form a display region of the micro LED display. The micro LED display has advantages of long service life, high contrast, high resolution, fast response speed, wide viewing angle, rich colors, ultra-high brightness, low power consumption, etc. For example, the micro LED display can be applied to a television, a notebook computer, a display, a mobile phone, a watch, a wearable display, an on-board device, a virtual reality (VR) device, an augmented reality (AR) device, a portable electronic device, a game console, or other electronic devices.

Figure 3:
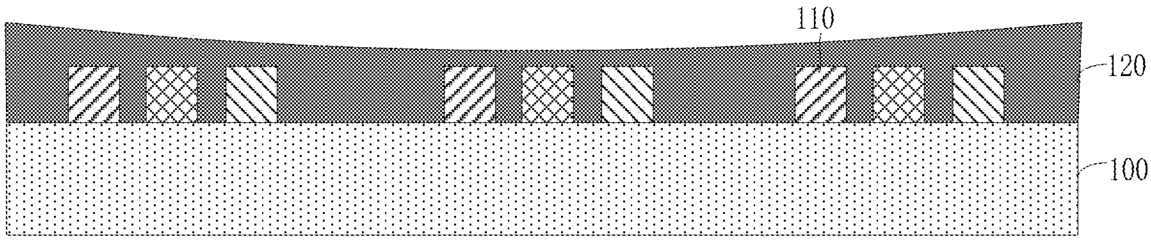
FIG. 3 is a schematic structural view of a light-shielding layer in the present disclosure.
Figure 4:
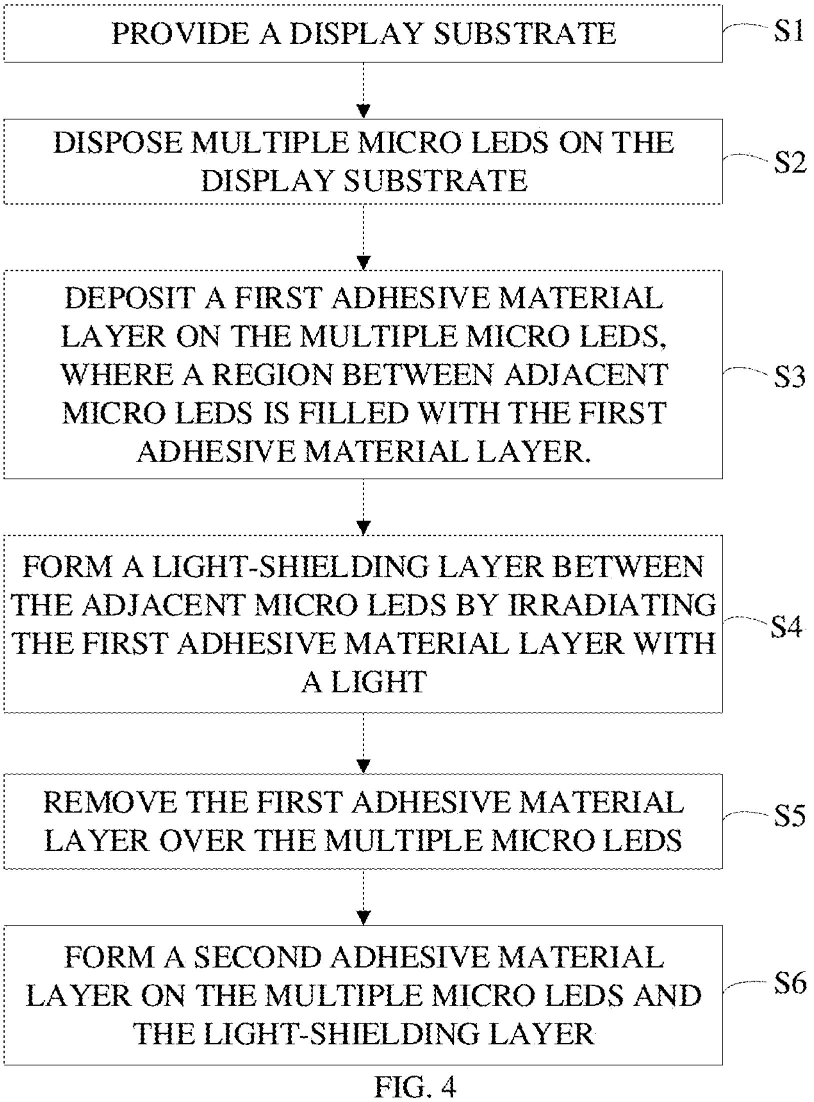
FIG. 4 is a manufacturing flow diagram of a micro LED display in the present disclosure.

Reference is made to FIG. 1 and FIG. 2. In a manufacturing process of the micro LED display, the micro LEDs 110 are welded to be electrically connected with the driving circuit after the micro LEDs 110 are transferred to the display substrate 100. In addition, three adjacent micro LEDs 110 that emit a red light, a blue light, and a green light respectively form a pixel structure. To avoid cross color between adjacent micro LEDs 110 of different colors, a light-shielding layer 120 is formed between the adjacent micro LEDs 110. In some implementations, for example, a layer of black sealant is deposited between the adjacent micro LEDs 110, and the black sealant is formed by using a method such as adhesive dispensing, i.e., a region between the adjacent micro LEDs 110 is covered by the black sealant. However, a speed of the adhesive dispensing is slow, which is not beneficial to improvement of production capacity. Moreover, the black sealant needs to be deposited for multiple times to form the light-shielding layer, and the height of the light-shielding layer is difficult to control. Reference is made to FIG. 3. In other implementations, for example, liquid epoxy resin and carbon-containing material each are deposited on the micro LEDs 110 and between the adjacent micro LEDs 110 to form the light-shielding layer 120, which is a simple process. However, when liquid materials with high viscosity are deposited, surface smoothness of the light-shielding layer 120 is uncontrollable, and an adhesive material is thicker at an edge part of the display and thinner at a center part of the display. Furthermore, the epoxy resin and carbon-containing material each have a relatively poor light-shielding effect, such that cross color is easy to occur.

Based on this, the present disclosure aims to provide a manufacturing method of the micro LED display. An adhesive material layer made of a photosensitive material is deposited on micro LEDs and a region between adjacent micro LEDs, and the adhesive material layer is irradiated with a special light, such that the adhesive material layer between the adjacent micro LEDs forms a light-shielding layer after irradiation, so as to prevent cross color between the adjacent micro LEDs of different colors, and further improve the light-emitting effect of the micro LED display.

Reference is made to FIG. 1 and FIG. 2. In an implementation of the present disclosure, the micro LED display includes a display substrate 100, multiple micro LEDs 110 disposed on the display substrate 100, a light-shielding layer 120 disposed between adjacent micro LEDs 110, and a transparent adhesive material layer disposed on the light-shielding layer 120 and the micro LEDs 110.

Reference is made to FIG. 1 and FIG. 2. In an implementation of the present disclosure, the multiple micro LEDs 110 are arranged in a matrix on the display substrate 100. The multiple micro LEDs 110 include a red micro LED 111, a green micro LED 112, and a blue micro LED 113. Each of the multiple micro LEDs 110 is a sub-pixel. The red micro LED 111 can form a red sub-pixel, the green micro LED 112 can form a green sub-pixel, the blue micro LED 113 can form a blue sub-pixel, and the red micro LED 111, the green micro LED 112, and the blue micro LED 113 arranged in sequence form a pixel structure. Multiple pixel structures arranged in an array are disposed on the display substrate 100. Under the control of multiple driving circuits disposed on the display substrate 100, the micro LEDs 110 of three colors are able to emit lights independently, and then color mixing is formed, such that the pixel structures emit a preset colored light finally. The multiple pixel structures are arranged in an array on the display substrate 100, such that the display can realize a display effect of a colored image correspondingly. The region between the adjacent LEDs 110 is filled with the light-shielding layer 120, and the light-shielding layer 120 exceeds each of the micro LEDs 110, such that the multiple micro LEDs 110 each are ensured to emit a forward light. Here, there is less interference between lights of different colors, which can reduce color shift and cross color, and ensure the light-emitting effect of the micro LED display.

Reference is made to FIG. 2 and FIG. 3. A manufacturing method of a micro LED display is further provided in the present disclosure. The method includes the following.

S1, a display substrate is provided.

S2, multiple micro LEDs are disposed on the display substrate.

S3, a first adhesive material layer is deposited on the multiple micro LEDs, where a region between adjacent micro LEDs is filled with the first adhesive material layer.

S4, a light-shielding layer is formed between the adjacent micro LEDs by irradiating the first adhesive material layer with a light.

S5, the first adhesive material layer on the multiple micro LEDs is removed.

S6, a second adhesive material layer is formed on the multiple micro LEDs and the light-shielding layer.

Figure 5:
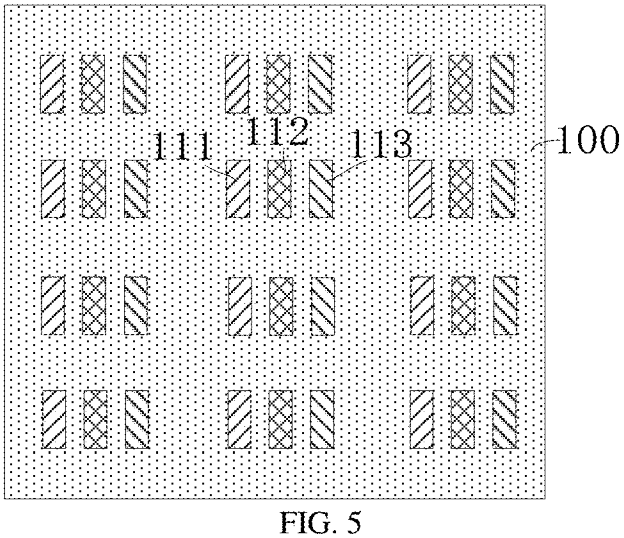
FIG. 5 is a schematic view of an arrangement of micro LEDs on a display substrate in the present disclosure.
Figure 6:
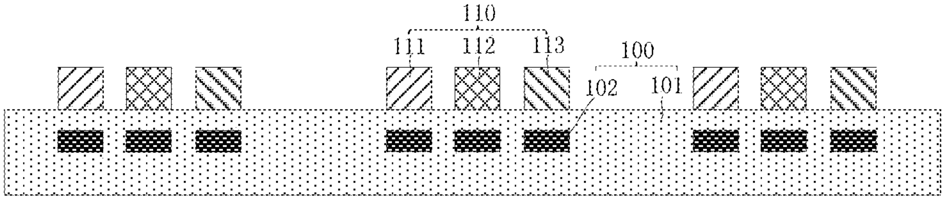
FIG. 6 is a schematic structural view of a driving device disposed in a substrate in the present disclosure.
Figure 7:
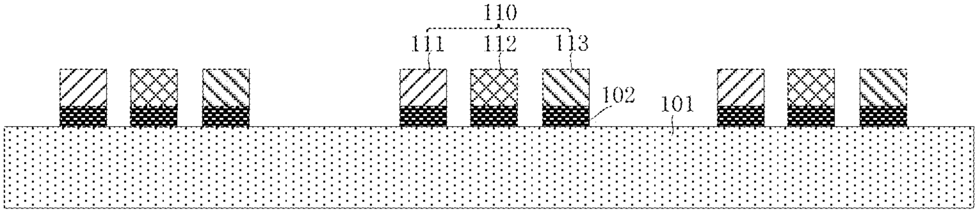
FIG. 7 is a schematic structural view of a driving device and a micro LED arranged at the same side in the present disclosure.
Figure 8:
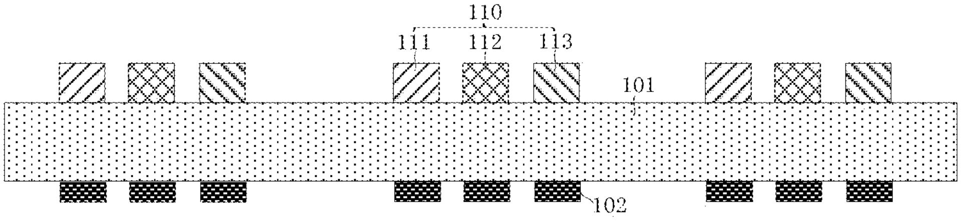
FIG. 8 is a schematic structural view of a driving device and a micro LED arranged at opposite sides in the present disclosure.

Reference is made to FIG. 5 to FIG. 8. In an implementation of the present disclosure, the display substrate 100 provided in the present disclosure is a thin film transistor (TFT) backplane. The display substrate 100 includes a substrate 101, and a driving circuit, and multiple sets of metal pads (not illustrated in the figure). The metal pads are electrically connected with the driving circuit. The driving circuit includes multiple driving devices 102, and the multiple driving devices 102 are connected with one another through a circuit to form the driving circuit. As illustrated in FIG. 6, in this implementation, the driving devices 102 are disposed in the substrate 101. For example, the driving devices 102 may be welded to the display substrate 100 on one layer of substrate 101 by using surface mount technology (SMT) or laser welding technology, and the driving devices 102 may be electrically connected with one another by using a printed circuit or a circuit formed by exposure to form the driving circuit. In addition, another layer of substrate 101 is adhered or pressed on the driving devices 102 to form the display substrate 100 in which the driving device 102 is disposed in the substrate 101. The metal pads are disposed on a surface of the substrate 101 and electrically connected with the driving circuit. As illustrated in FIG. 7 and FIG. 8, in other implementations, the driving device 102 is disposed on the surface of the substrate 101, and the driving device 102 and the micro LED 110 may be disposed at the same side of the substrate 101 or opposite sides of the substrate 101. When the driving device 102 and the micro LED 110 are disposed at the same side of the substrate 101, the metal pad is disposed on the surface of the substrate 101, and the metal pad and the driving device 102 are disposed at the same side of the substrate 101. When the driving device 102 and the micro LED 110 are disposed at the opposite sides of the substrate 101, the metal pad is disposed on a surface of the substrate 101 where the micro LED 110 is disposed, and the metal pad is electrically connected with the driving device 102 through a circuit. Moreover, each set of metal pads includes a positive-electrode pad and a negative-electrode pad, the positive-electrode pad is connected with a positive electrode of the micro LED 110, and the negative-electrode pad is connected with a negative electrode of the micro LED 110. Furthermore, after being coated, exposed, developed, etched, and lifted off, the metal pad made of one or more of titanium (Ti), gold (Au), tin (Sn), copper (Cu), indium (In), silver (Ag), platinum (Pt), chromium (Cr), and nickel (Ni) is formed.

Reference is made to FIG. 5. In an implementation of the present disclosure, the multiple micro LEDs 110 can be transferred to the display substrate 100 by massive transfer, and the multiple micro LEDs 110 are electrically connected with the driving circuit. Specific methods of transferring the micro LEDs 110 may include a van der Waals force, an electrostatic force, a magnetic force, a laser transfer, a fluidic self-assembly, and a roll-to-roll transfer. In this implementation, the micro LEDs 110 are transferred by using the van der Waals force. A transfer structure is, for example, an elastomeric stamp, and the elastomeric stamp is made of polydimethylsiloxane (PDMS). The micro LEDs 110 can be picked up by the elastomeric stamp and then transferred to the display substrate 100. During pickup of the micro LEDs 110, the elastomeric stamp keeps a relatively high speed, and an adsorption force between the elastomeric stamp and the micro LEDs 110 is relatively large. During placing of the micro LEDs 110 on the display substrate 100, the elastomeric stamp keeps a relatively low transfer speed, and the adsorption force between the elastomeric stamp and the micro LEDs 110 is relatively small. In addition, when the micro LEDs 110 are transferred by using the elastomeric stamp, a temperature of the elastomeric stamp can be adjusted to ensure a transfer effect. For example, during pickup and transfer of the micro LEDs 110, a relatively low temperature is used to ensure a relatively large adsorption force between the elastomeric stamp and the micro LEDs 110, and during placing of the micro LEDs 110, a relatively high temperature is used to ensure a relatively small adsorption force between the elastomeric stamp and the micro LEDs 110.

Reference is made to FIG. 5. In an implementation of the present disclosure, the micro LEDs 110 on the display substrate 100 include a red micro LED 110, a green micro LED 110, and a blue micro LED 110, and the micro LEDs 110 of three light colors are arranged side by side to form a pixel structure. During transfer, the transfer can be performed in batches according to light colors. For example, all red micro LEDs can be transferred to the display substrate 100 first, then all green micro LEDs 110 can be transferred to the display substrate 100, and finally all blue micro LEDs 110 can be transferred to the display substrate 100, such that pixel structures arranged in an array are formed.

Figure 9:
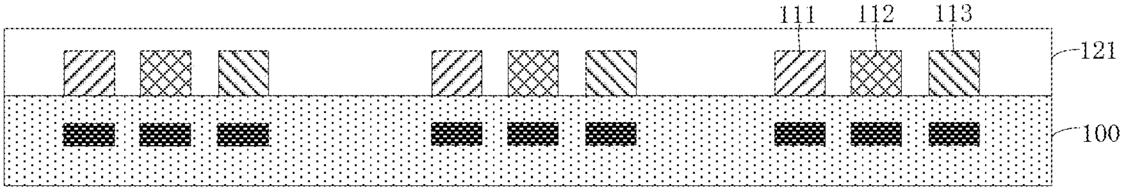
FIG. 9 is a schematic structural view of a first adhesive material layer in the present disclosure.

Reference is made to FIG. 9. In an implementation of the present disclosure, after the micro LEDs 110 are transferred to the display substrate 100, the first adhesive material layer 121 is formed on the micro LEDs 110. Specifically, a first type of adhesive material can be sprayed on the micro LEDs 110 and between the adjacent micro LEDs 110, and the first type of adhesive material can be hot-pressed under a preset pressure, such that the first type of adhesive material fills the region between the adjacent micro LEDs 110 and the first adhesive material layer 121 cured is formed. The preset pressure ranges from 4.5 MPa to 7 MPa, specifically, such as 5 MPa, 6 MPa, 7 MPa, etc. A temperature during hot pressing ranges from 150° C. to 220° C., specifically, such as 150° C., 170° C., 190° C., 210° C., etc. In addition, to ensure a quality of the first adhesive material layer 121 formed, the first adhesive material layer 121 can be formed by repeatedly spraying adhesive and repeatedly hot pressing.

Reference is made to FIG. 9. In an implementation of the present disclosure, the first adhesive material layer 121 is made of a photosensitive material that becomes black when exposed to a light, and specifically includes a photosensitive material such as silver halide, silver chloride, silver fluoride, etc. In a specific implementation, the first type of adhesive material may be, for example, AVENTK 1098UV black adhesive. The first adhesive material layer 121 formed fills the region between the adjacent micro LEDs 110, and has a thickness exceeding the micro LED 110. The thickness of the first adhesive material layer 121 is, for example, 20~60 μm. Specifically, the thickness of the first adhesive material layer 121 is, for example, 25 μm, 30 μm, 35 μm, 40 μm, 45 μm, 50 μm, 55 μm, 60 μm, etc.

Figure 10:
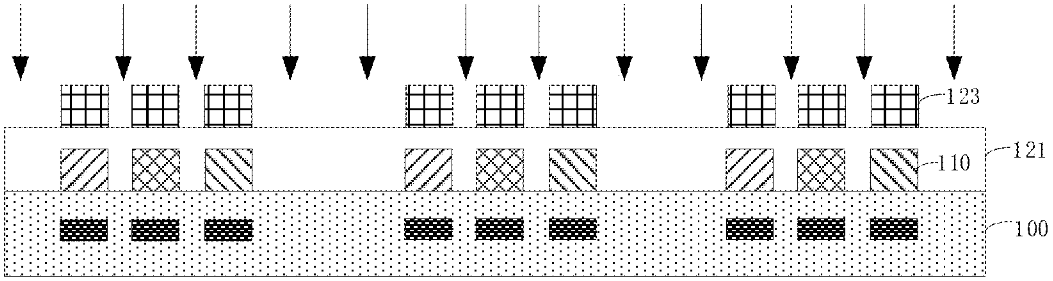
FIG. 10 is a schematic structural view of a first adhesive material layer irradiated with a light in the present disclosure.

Reference is made to FIG. 9 to FIG. 10. In an implementation of the present disclosure, after the first adhesive material layer 121 is formed, a first photoresist layer 123 is formed on the first adhesive material layer 121, and the first adhesive material layer 121 is irradiated with a light by using the first photoresist layer 123 as a mask. Specifically, a photoresist can be coated on the first adhesive material layer 121, and the photoresist coated can be patterned by photolithography processes such as exposure, development, etc., to form the first photoresist layer 123 patterned. The first photoresist layer 123 patterned is able to ensure that the first adhesive material layer 121 covered by the first photoresist layer 123 does not change color due to being irradiated with the light. In this implementation, the first photoresist layer 123 covers the micro LED 110. As illustrated in FIG. 10, the light is perpendicular to a plane where the first adhesive material layer 121 is located, thereby ensuring that the light is only able to irradiate the first adhesive material layer 121 between the adjacent micro LEDs 110, and preventing the first adhesive material layer 121 on the micro LED 110 from changing color due to being irradiated with the light. In addition, in this implementation, the light has a wavelength ranging from 190 nm to 400 nm, specifically, such as 200 nm, 280 nm, 365 nm, 400 nm, etc.

Figure 11:
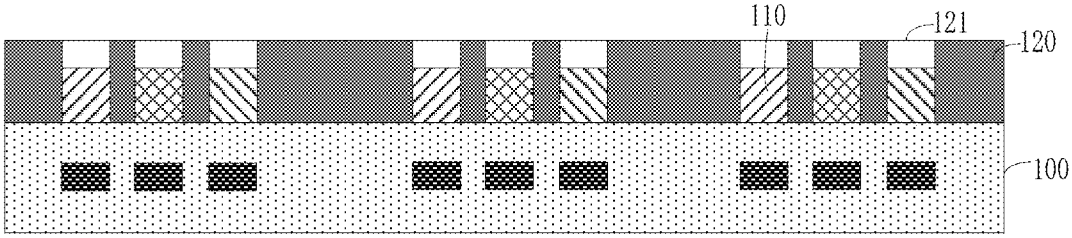
FIG. 11 is a schematic structural view of a light-shielding layer formed by a first type of adhesive material in the present disclosure.

Reference is made to FIG. 10 to FIG. 11. In an implementation of the present disclosure, after being irradiated with the light, the first adhesive material layer 121 between the adjacent micro LEDs 110, which is originally transparent, becomes black to form the light-shielding layer 120. The first photoresist layer 123 can then be removed. The light-shielding layer 120 formed is a black adhesive material layer and is an opaque black adhesive material layer, so the light-shielding layer 120 is able to avoid cross color between adjacent micro LEDs of different colors. The first adhesive material layer 121 covered by the first photoresist layer 123, that is, the first adhesive material layer 121 on the micro LED 110, is still a transparent adhesive material, which can be easily etched later. In addition, the light-shielding layer 120 formed exceeds the micro LED 110, and the light-shielding layer 120 exceeds the micro LED 110 by, such as 10~50 μm, specifically, such as 10 μm, 15 μm, 25 μm, 30 μm, 35 μm, 40 μm, 45 μm, 50 μm, etc. A relatively tall light-shielding layer 120 can ensure relatively less interference of a forward light emitted by the micro LED 110, such that cross color between the adjacent micro LEDs 100 of different colors is further avoided, thereby avoiding color shift.

Figure 12:
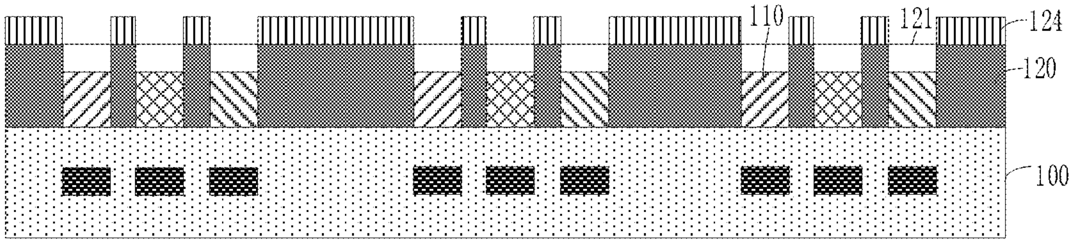
FIG. 12 is a schematic structural view of a first adhesive material layer etched in the present disclosure.
Figure 13:
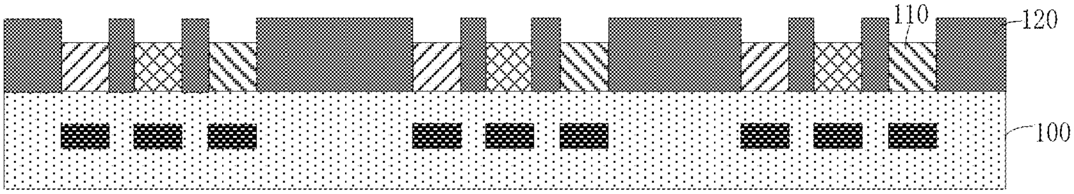
FIG. 13 is a schematic structural view of a light-shielding layer with a first adhesive material layer being removed in the present disclosure.

Reference is made to FIG. 11 to FIG. 13. In an implementation of the present disclosure, after the light-shielding layer 120 is formed, the first adhesive material layer 121 on the micro LED 110 needs to be removed. The photoresist can be coated on the light-shielding layer 120 first, and the photoresist coated can be patterned by photolithography processes such as exposure, development, etc., to form a second photoresist layer 124 patterned. The light-shielding layer 120 is ensured not to be etched with the aid of the second photoresist layer 124 patterned. In this implementation, for example, the first adhesive material layer 121 on the micro LED 110 may be etched by a dry etch process.

Figure 14:
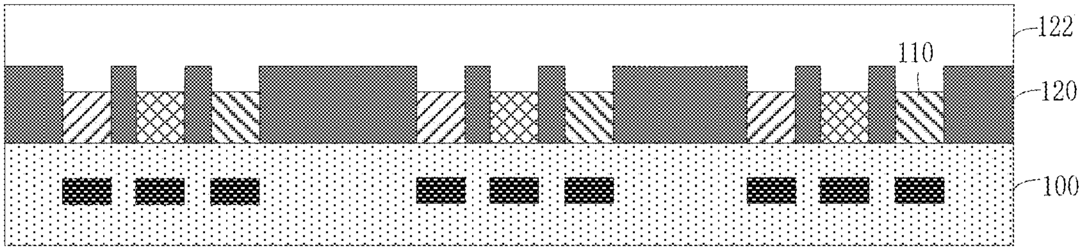
FIG. 14 is a schematic structural view of a second adhesive material layer in the present disclosure.

Reference is made to FIG. 12 to FIG. 14. In an implementation of the present disclosure, after the first adhesive material layer 121 on the micro LED 110 is removed, the second photoresist layer 124 is removed, and a second adhesive material layer 122 is formed on the micro LED 110 and the light-shielding layer 120. For example, silica gel or epoxy adhesive can be sprayed on the micro LED 110 and the light-shielding layer 120 to form a second transparent adhesive material layer 122. The second adhesive material layer 122 covers the micro LED 110 and the light-shielding layer 120 to seal the micro LED 110. In addition, the second adhesive material layer 122 is a transparent adhesive material layer, which ensures the light-emitting effect of the micro LED 110. In other implementations, a functional film, such as a fingerprint-proof film and a grease-proof film, may also be formed on the second adhesive material layer 122.

Figure 15:
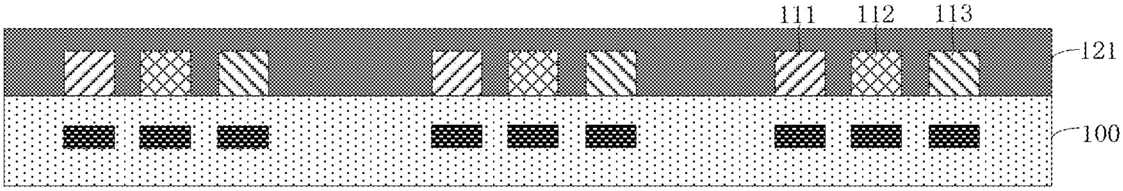
FIG. 15 is a schematic structural view of a first adhesive material layer in another implementation of the present disclosure.

Reference is made to FIG. 15. In another implementation of the present disclosure, the material of the first adhesive material layer 121 is different from the first type of adhesive material, such as a second type of adhesive material. A method of manufacturing the first adhesive material layer by using the second type of adhesive material can be the same as the method of manufacturing the first adhesive material layer by using the first type of adhesive material. Specifically, the second type of adhesive material can be sprayed on the micro LEDs 110 and between the adjacent micro LEDs 110, and the second type of adhesive material is hot-pressed under a preset pressure, such that the region between the adjacent micro LEDs 110 is filled with the second type of adhesive material, and the first adhesive material layer 121 cured is formed.

Reference is made to FIG. 15. In another implementation of the present disclosure, the second type of adhesive material includes a shadowless adhesive, which mainly includes an oligomer diol material, and the second type of adhesive material further includes a photosensitizer. In this implementation, the photosensitizer is a black photosensitizer, which becomes transparent after being irradiated, and the black photosensitizer is, for example, a phenolic polymer. The first adhesive material layer 121 formed fills the region between the adjacent micro LEDs 110 by the second type of adhesive material, and has a thickness exceeding the micro LED 110. The thickness of the first adhesive material layer 121 is, for example, 20~60 μm. Specifically, the thickness of the first adhesive material layer 121 is, for example, 25 μm, 30 μm, 35 μm, 40 μm, 45 μm, 50 μm, 55 μm, 60 μm, etc.

Figure 16:
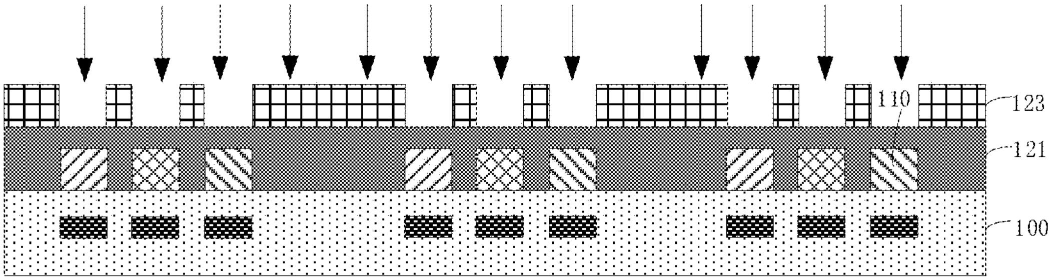
FIG. 16 is a schematic structural view of a first adhesive material layer irradiated with a light in another implementation of the present disclosure.

Reference is made to FIG. 15 to FIG. 16. In another implementation of the present disclosure, after the first adhesive material layer 121 is formed, the first photoresist layer 123 is formed on the first adhesive material layer 121, and the first adhesive material layer 121 is irradiated with a light by using the first photoresist layer 123 as a mask. A photoresist can be coated on the first adhesive material layer 121, and the photoresist coated can be patterned by photolithography processes such as exposure, development, etc., to form the first photoresist layer 123 patterned. The first photoresist layer 123 patterned is able to ensure that the first adhesive material layer 121 covered by the first photoresist layer 123 does not change color due to being irradiated with the light. In this implementation, the first photoresist layer 123 covers the region between the adjacent micro LEDs 110. As illustrated in FIG. 16, the light is perpendicular to a plane where the first adhesive material layer 121 is located, thereby ensuring that the light is only able to irradiate the first adhesive material layer 121 on the micro LED 110, and preventing the first adhesive material layer 121 between the adjacent micro LEDs 110 from changing color due to being irradiated with the light. In addition, in this implementation, the light has a wavelength ranging from 190 nm to 400 nm, specifically, such as 200 nm, 280 nm, 365 nm, 400 nm, etc.

Figure 17:
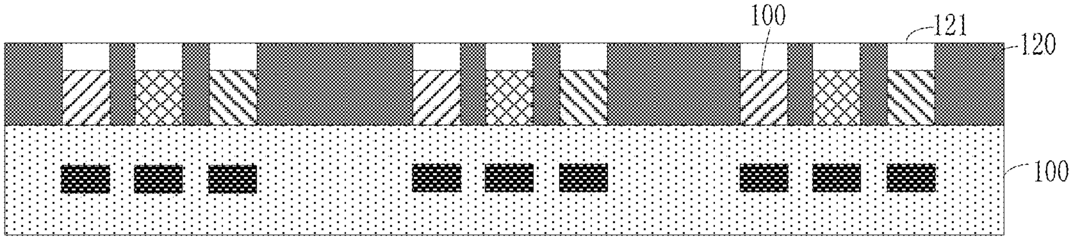
FIG. 17 is a schematic structural view of a light-shielding layer formed by a second type of adhesive material in the present disclosure.

Reference is made to FIG. 16 to FIG. 17. In another implementation of the present disclosure, after being irradiated with the light, the first adhesive material layer 121 on the micro LED 110 changes from black to transparent. However, the first adhesive material layer 121 between the adjacent micro LEDs 110 is still black, and the light-shielding layer 120 is formed. The light-shielding layer 120 is a black adhesive material layer and an opaque brown adhesive material layer, so the light-shielding layer 120 is able to avoid cross color between adjacent micro LEDs. In addition, the light-shielding layer 120 formed exceeds the micro LED 110, and the light-shielding layer 120 exceeds the micro LED 110 by, such as 10-50 μm, specifically, such as 10 μm, 15 μm, 25 μm, 30 μm, 35 μm, 40 μm, 45 μm, 50 μm, etc. A relatively tall light-shielding layer 120 can ensure relatively less interference of a forward light emitted by the micro LED 110, such that cross color between the adjacent micro LEDs 110 is further avoided, thereby avoiding color shift.

Figure 18:
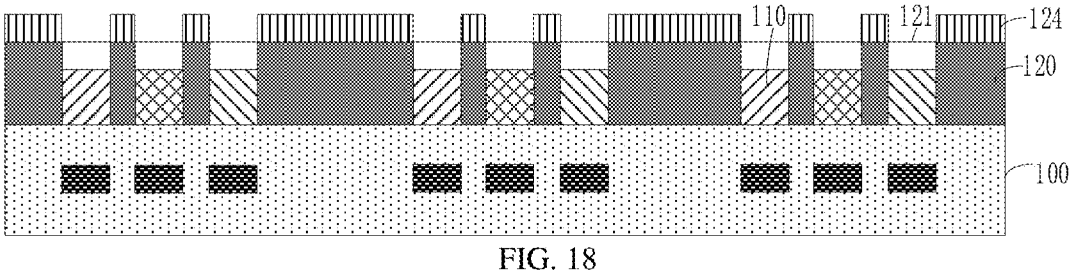
FIG. 18 is a schematic structural view of a first adhesive material layer etched in another implementation of the present disclosure.
Figure 19:
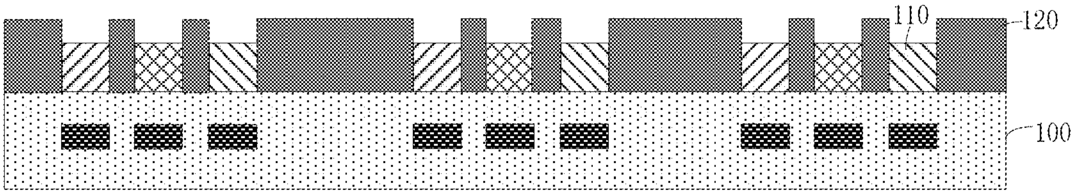
FIG. 19 is a schematic structural view of a light-shielding layer with a first adhesive material layer being removed in another implementation of the present disclosure.
Figure 20:
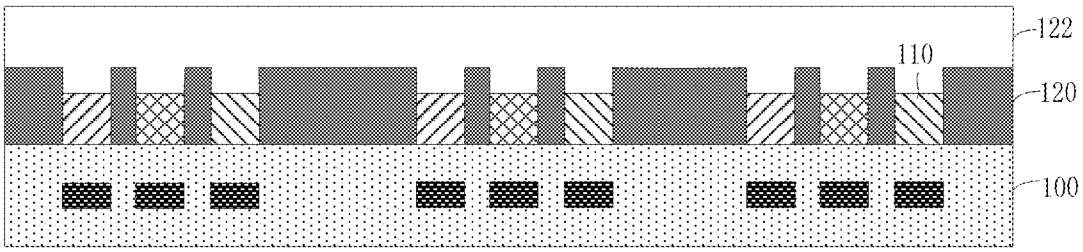
FIG. 20 is a schematic structural view of a second adhesive material layer in another implementation of the present disclosure.

Reference is made to FIG. 18 to FIG. 19. In another implementation of the present disclosure, after the light-shielding layer 120 is formed, the first adhesive material layer 121 on the micro LED 110 is removed. The photoresist can be coated on the light-shielding layer 120 first, and the photoresist coated can be patterned by photolithography processes such as exposure, development, etc., to form a second photoresist layer 124 patterned. The light-shielding layer 120 is ensured not to be etched with the aid of the second photoresist layer 124 patterned. In this implementation, for example, the first adhesive material layer 121 on the micro LED 110 may be etched by a dry etch process.

Reference is made to FIG. 18 to FIG. 19. In another implementation of the present disclosure, after the first adhesive material layer 121 on the micro LED 110 is removed, the second photoresist layer 124 is removed, and a second adhesive material layer 122 is formed on the micro LED 110 and the light-shifting layer 120. For example, silica gel or epoxy adhesive can be sprayed on the micro LED 110 and the light-shielding layer 120 to form a second transparent adhesive material layer 122. The second adhesive material layer 122 covers the micro LED 110 and the light-shielding layer 120 to seal the micro LED 110. In addition, the second adhesive material layer 122 is a transparent adhesive material layer, which ensures the light-emitting effect of the micro LED 110. In other implementations, a functional film, such as a fingerprint-proof film and a grease-proof film, may also be formed on the second adhesive material layer 122.

To sum up, according to the micro LED display and the manufacturing method thereof provided in the present disclosure, the micro LEDs are formed on the display substrate. The first adhesive material layer is formed on the micro LEDs and between the adjacent micro LEDs. A black opaque light-shielding layer is formed between the adjacent micro LEDs by irradiating the first adhesive material layer with the light. The light-shielding layer exceeds the micro LED. The light-shielding layer is formed as follows. The first transparent adhesive material layer covering the micro LEDs is formed first, and the first adhesive material layer between the adjacent micro LEDs is irradiated with the light, such that the first adhesive material layer between the adjacent micro LEDs becomes a black opaque adhesive material layer, thereby forming the light-shielding layer. In addition, the black opaque adhesive material layer covering the micro LEDs is formed first, and the first adhesive material layer on the micro LED is irradiated with the light, such that the first adhesive material layer on the micro LED becomes a transparent adhesive material layer, the first adhesive material layer between the adjacent micro LEDs is still the black opaque adhesive material layer, thereby forming the light-shielding layer. According to the micro LED display and the manufacturing method thereof provided in the present disclosure, the first adhesive material layer is deposited by depositing a single adhesive material layer, which is a simple process. Moreover, the light-shielding layer is formed between the adjacent micro LEDs by irradiating the first adhesive material layer with light, so as to ensure that the micro LED emits a forward light and the cross color does not occur between the adjacent micro LEDs of different colors.

It should be understood that the application of the present disclosure is not limited to the above examples, and for those of ordinary skill in the art, improvements or modifications can be made according to the above descriptions, and all such improvements and modifications shall fall within the protection scope of the appended claims of the present disclosure.

What is claimed is:

1. A manufacturing method of a micro light-emitting diode (LED) display, at least comprising:
providing a display substrate;
disposing a plurality of micro LEDs on the display substrate;
forming a first adhesive material layer on the plurality of micro LEDs, wherein a region between adjacent micro LEDs is filled with the first adhesive material layer, and forming the first adhesive material layer on the plurality of micro LEDs comprises:
spraying a first type of adhesive material on the plurality of micro LEDs and between the adjacent micro LEDs; and hot-pressing the first type of adhesive material under a preset pressure, to make the first type of adhesive material fill the region between the adjacent micro LEDs; or
spraying a second type of adhesive material on the plurality of micro LEDs and between the adjacent micro LEDs; and hot-pressing the second type of adhesive material under a preset pressure, to make the second type of adhesive material fill the region between the adjacent micro LEDs; and
forming a light-shielding layer between the adjacent micro-LEDs by irradiating the first adhesive material layer with a light.

2. The manufacturing method of the micro LED display of claim 1, wherein the preset pressure ranges from 4.5 MPa to 7 MPa, and a temperature during hot-pressing ranges from 150° C. to 220° C.

3. The manufacturing method of the micro LED display of claim 1, wherein the first type of adhesive material comprises silver halide, silver chloride, or silver fluoride.

4. The manufacturing method of the micro LED display of claim 3, wherein forming the light-shielding layer comprises:
forming a first photoresist layer on the first adhesive material layer, wherein the first photoresist layer covers the plurality of micro LEDs; and
irradiating the first adhesive material layer with the light by using the first photoresist layer as a mask, to make the first adhesive material layer irradiated becomes black to form the light-shielding layer.

5. The manufacturing method of the micro LED display of claim 4, wherein the light has a wavelength ranging from 190 nm to 400 nm, and the light is perpendicular to a plane where the first adhesive material layer is located.

6. The manufacturing method of the micro LED display of claim 1, further comprising:
forming a second photoresist layer on the light-shielding layer; and
etching a region of the first adhesive material layer where no light-shielding layer is formed by using the second photoresist layer as a mask.

7. The manufacturing method of the micro LED display of claim 1, further comprising:
forming a second adhesive material layer on the plurality of micro-LEDs and the light-shielding layer, wherein the second adhesive material layer is a transparent adhesive material layer.

8. The manufacturing method of the micro LED display of claim 1, wherein the second type of adhesive material comprises a black photosensitizer, and the black photosensitizer becomes transparent after being irradiated with the light.

9. The manufacturing method of the micro LED display of claim 8, wherein forming the light-shielding layer comprises:
forming a first photoresist layer on the first adhesive material layer, wherein the first photoresist layer covers the region between the adjacent micro LEDs; and
irradiating the first adhesive material layer with the light by using the first photoresist layer as a mask, to make the first adhesive material layer irradiated with the light becomes transparent, and the first adhesive material layer that is between the adjacent micro LEDs and covered by the first photoresist layer form the light-shielding layer.

10. The manufacturing method of the micro LED display of claim 1, wherein the second type of adhesive material comprises a phenolic polymer.

* * * * *